(12) United States Patent
Wu et al.

(10) Patent No.: US 9,748,388 B2
(45) Date of Patent: Aug. 29, 2017

(54) METHOD OF FORMING STRAINED STRUCTURES OF SEMICONDUCTOR DEVICES

(71) Applicant: Taiwan Semiconductor Manufacturing Co., Ltd., Hsin-Chu (TW)

(72) Inventors: Cheng-Hsien Wu, Hsinchu (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/005,628

(22) Filed: Jan. 25, 2016

(65) Prior Publication Data
US 2016/0155801 A1    Jun. 2, 2016

Related U.S. Application Data

(62) Division of application No. 13/296,723, filed on Nov. 15, 2011, now Pat. No. 9,246,004.

(51) Int. Cl.
*H01L 29/78* (2006.01)
*H01L 21/3065* (2006.01)
(Continued)

(52) U.S. Cl.
CPC ...... *H01L 29/7848* (2013.01); *H01L 21/3065* (2013.01); *H01L 29/0653* (2013.01);
(Continued)

(58) Field of Classification Search
CPC ..... H01L 21/823412; H01L 21/823418; H01L 21/823807; H01L 21/823814; H01L 29/7848; H01L 29/0847
See application file for complete search history.

(56) References Cited

U.S. PATENT DOCUMENTS 5,048,039 A * 9/1991 Tsubota ............... H01S 5/1228
                                                       372/45.013
7,592,213 B2  9/2009 Datta et al.
(Continued)

FOREIGN PATENT DOCUMENTS

CN         101908543         12/2010
CN         102237408         11/2011
(Continued)

OTHER PUBLICATIONS

Office Action dated Apr. 25, 2013 from corresponding application No. KR-10-2012-0004986.
(Continued)

*Primary Examiner* — Stephen W Smoot
*Assistant Examiner* — Sun M King
(74) *Attorney, Agent, or Firm* — Haynes and Boone, LLP

(57) ABSTRACT

A method of fabricating a semiconductor device comprises providing a substrate with a shallow trench isolation (STI) within the substrate and a gate stack. A cavity is formed between the gate stack and the STI. The cavity comprises one sidewall formed by the STI, one sidewall formed by the substrate, and a bottom surface formed by the substrate. A film is grown in the cavity and thereafter an opening formed by removing a first portion of the strained film until exposing the bottom surface of the substrate while a second portion of the strained film adjoins the STI sidewall. Another epitaxial layer is then grown in the opening.

19 Claims, 6 Drawing Sheets

(51) Int. Cl.
  *H01L 29/08*    (2006.01)
  *H01L 29/06*    (2006.01)
  *H01L 29/20*    (2006.01)
  *H01L 29/22*    (2006.01)
  *H01L 29/267*   (2006.01)
  *H01L 29/66*    (2006.01)

(52) U.S. Cl.
  CPC .......... *H01L 29/0847* (2013.01); *H01L 29/20* (2013.01); *H01L 29/22* (2013.01); *H01L 29/66795* (2013.01); *H01L 29/267* (2013.01); *H01L 29/66628* (2013.01); *H01L 29/66636* (2013.01)

(56) References Cited

U.S. PATENT DOCUMENTS

| | | | |
|---|---|---|---|
| 7,759,199 B2 | 7/2010 | Thomas et al. | |
| 7,879,675 B2* | 2/2011 | Radosavljevic | H01L 23/485 257/E21.425 |
| 8,361,847 B2 | 1/2013 | Johnson et al. | |
| 8,502,301 B2 | 8/2013 | Suzuki et al. | |
| 8,648,422 B2* | 2/2014 | Sakuma | H01L 21/28518 257/368 |
| 8,796,788 B2 | 8/2014 | Kwok et al. | |
| 2007/0210301 A1* | 9/2007 | Han | H01L 29/165 257/18 |
| 2009/0045411 A1* | 2/2009 | Lin | H01L 29/66553 257/77 |
| 2009/0075029 A1* | 3/2009 | Thomas | H01L 21/02381 428/173 |
| 2009/0242995 A1* | 10/2009 | Suzuki | H01L 21/82341 257/368 |
| 2010/0252862 A1 | 10/2010 | Ko et al. | |
| 2011/0272739 A1 | 11/2011 | Lee et al. | |
| 2012/0181549 A1* | 7/2012 | Johnson | H01L 29/0847 257/77 |

FOREIGN PATENT DOCUMENTS

| | | |
|---|---|---|
| KR | 10-0791441 | 1/2008 |
| KR | 10-2011-0052432 | 5/2011 |
| KR | 10-2011-0123194 | 11/2011 |
| WO | WO 2005/017964 | 2/2005 |

OTHER PUBLICATIONS

Notice of Allowance dated Oct. 7, 2013 and English translation from corresponding application No. KR-10-2012-0004986.

* cited by examiner

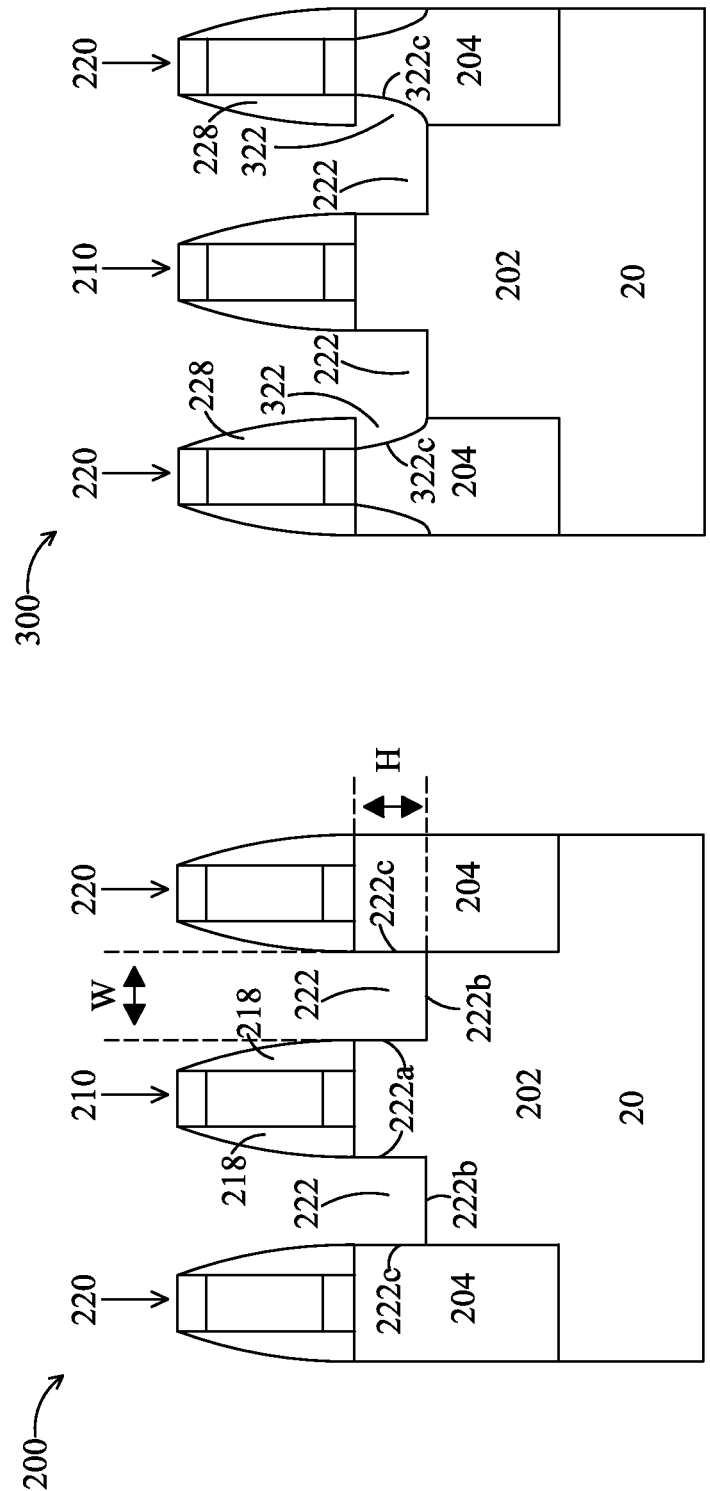

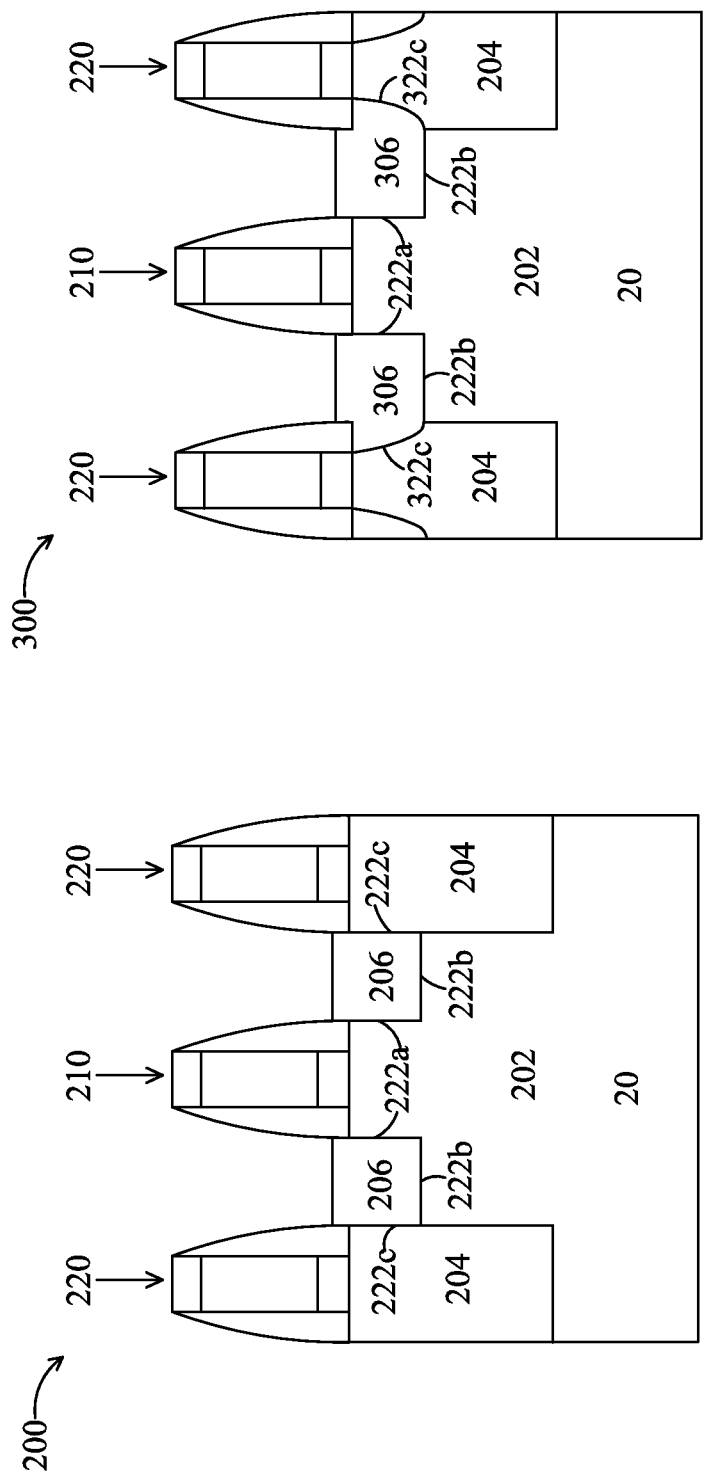

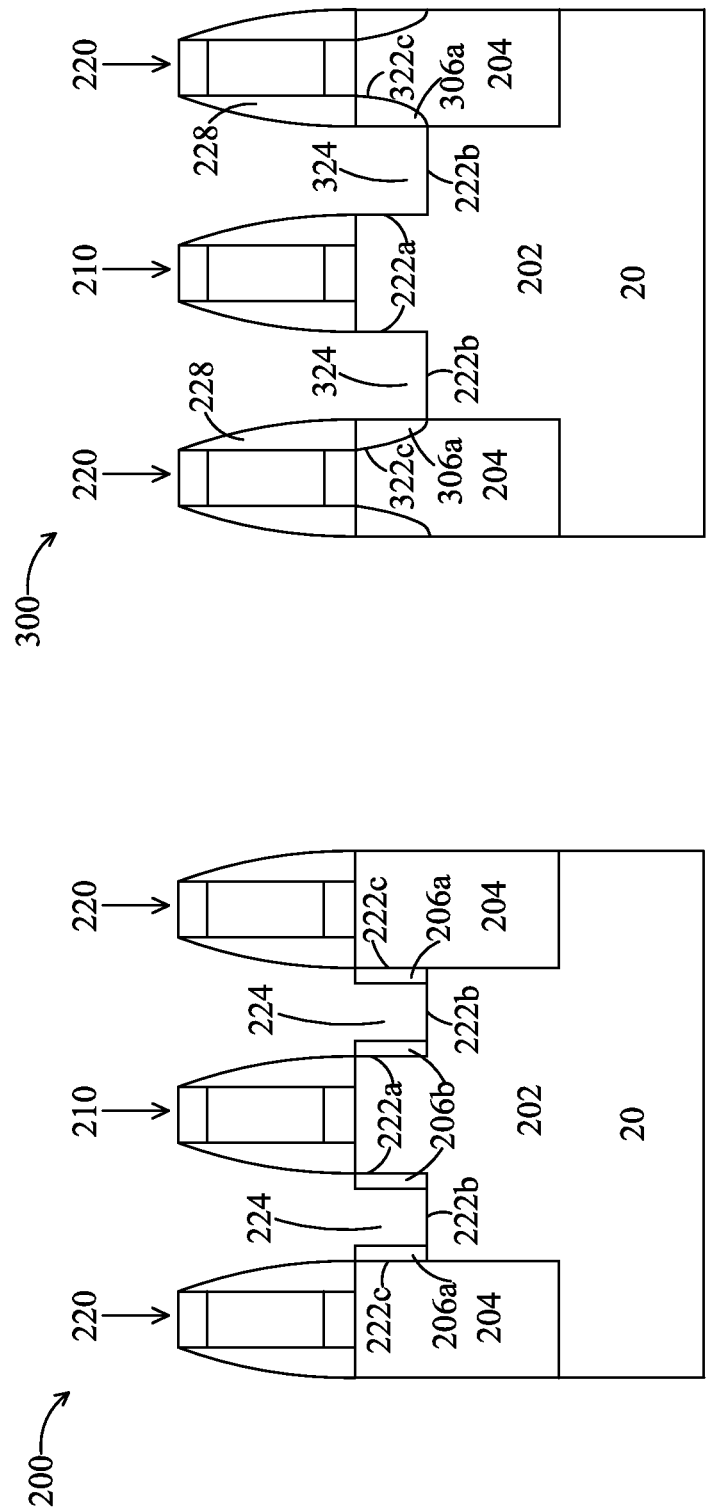

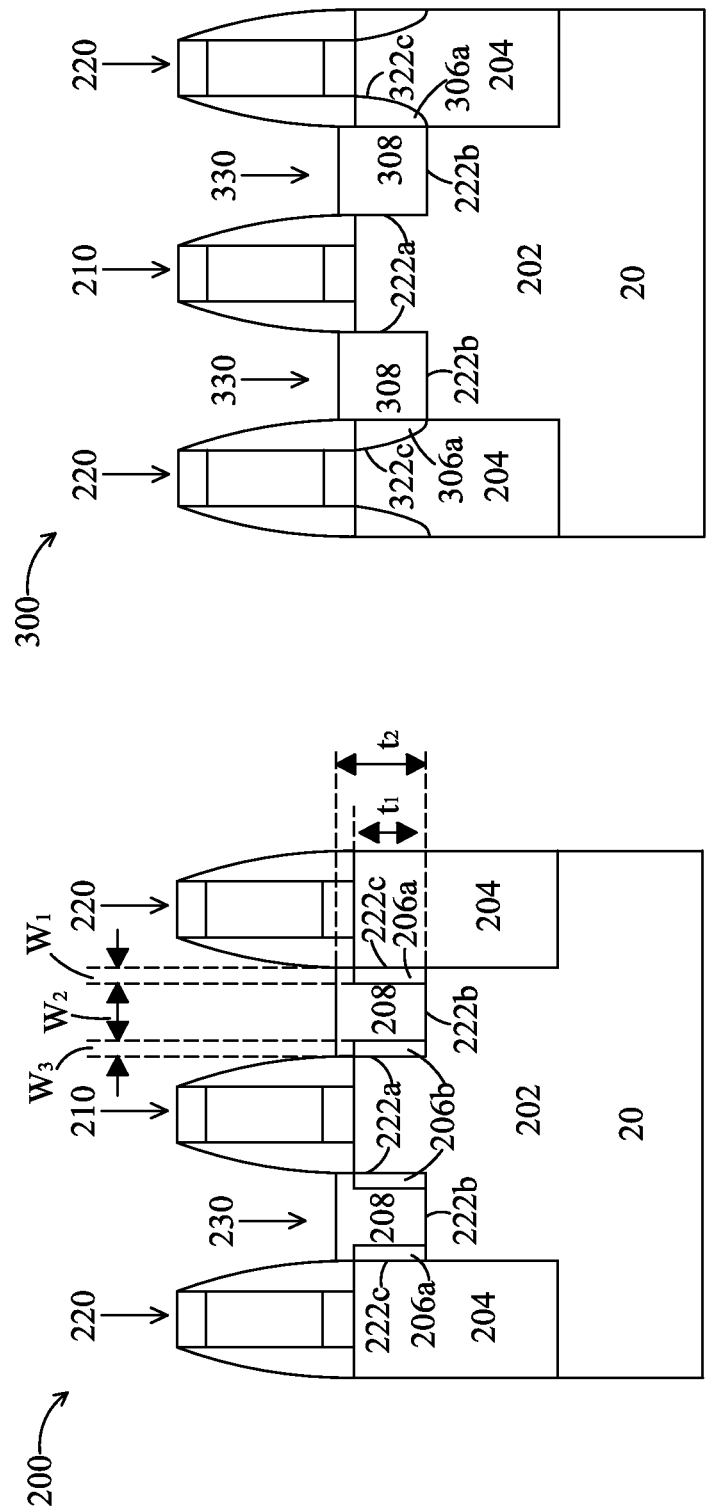

US 9,748,388 B2

METHOD OF FORMING STRAINED STRUCTURES OF SEMICONDUCTOR DEVICES

PRIORITY DATA

The present application is a Divisional Application of U.S. patent application Ser. No. 13/296,723, filed Nov. 15, 2011, issuing as U.S. Pat. No. 9,246,004, entitled "STRAINED STRUCTURES OF SEMICONDUCTOR DEVICES", of which is hereby incorporated by reference in its entirety.

TECHNICAL FIELD

This disclosure relates to integrated circuit fabrication and, more particularly, to a semiconductor device with a strained structure.

BACKGROUND

As the semiconductor industry has progressed into nanometer technology process nodes in pursuit of higher device density, higher performance, and lower costs, challenges from both fabrication and design issues have resulted in the development of three-dimensional designs of a semiconductor device, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over three sides (e.g., wrapping) the fin. Having a gate on both sides of the channel allows gate control of the channel from both sides. Further advantages of FinFETs comprise reducing the short channel effect and higher current flow.

However, there are challenges to implementation of such features and processes in complementary metal-oxide-semiconductor (CMOS) fabrication. For example, non-uniform distribution of strained materials causes non-uniformity of strains applied to the channel region of the semiconductor device, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2 and 3A-6A show schematic cross-sectional views of a semiconductor device comprising a strained structure at various stages of fabrication according to various aspects of the present disclosure; and FIGS. 3B-6B show schematic cross-sectional views of a semiconductor device comprising a strained structure at various stages of fabrication according to various aspects of the present disclosure.

DESCRIPTION

Figure 1:
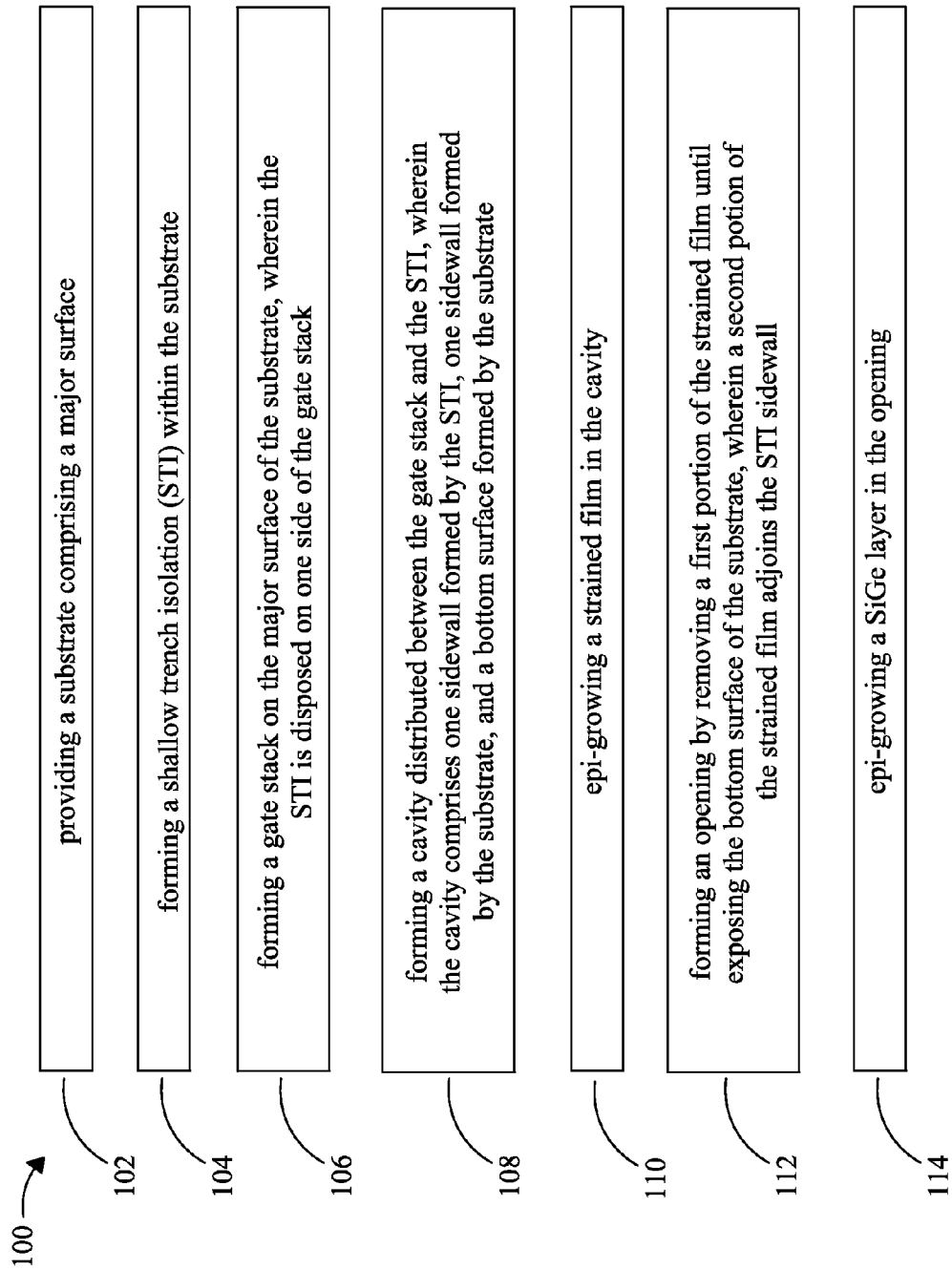
FIG. 1 is a flowchart illustrating a method of fabricating a semiconductor device according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, illustrated is a flowchart of a method 100 of fabricating a semiconductor device according to various aspects of the present disclosure. The method 100 begins with step 102 in which a substrate comprising a major surface is provided. The method 100 continues with step 104 in which a shallow trench isolation (STI) is formed within the substrate. The method 100 continues with step 106 in which a gate stack is formed on the major surface of the substrate, wherein the STI is disposed on one side of the gate stack. The method 100 continues with step 108 in which a cavity is formed distributed between the gate stack and the STI, wherein the cavity comprises one sidewall formed by the STI, one sidewall formed by the substrate, and a bottom surface formed by the substrate. The method 100 continues with step 110 in which a strained film is epitaxially grown in the cavity. The method 100 continues with step 112 in which an opening is formed by removing a first portion of the strained film until exposing the bottom surface of the substrate, wherein a second portion of the strained film adjoins the STI sidewall. The method 100 continues with step 114 in which a SiGe layer is epi-grown in the opening. The discussion that follows illustrates embodiments of semiconductor devices that can be fabricated according to the method 100 of FIG. 1.

FIGS. 2 and 3A-6A show schematic cross-sectional views of a semiconductor device 200 comprising a strained structure at various stages of fabrication according to various aspect of the present disclosure. FIGS. 3B-6B show schematic cross-sectional views of a semiconductor device 300 comprising a strained structure at various stages of fabrication according to various aspect of the present disclosure. As employed in the present disclosure, the term semiconductor devices 200, 300 refer to a fin field effect transistor (FinFET). The FinFET refers to any fin-based, multi-gate transistor. Alternatively, the term semiconductor devices 200, 300 refer to a planar field effect transistor (FET). The semiconductor devices 200, 300 may be included in a microprocessor, memory cell, and/or other integrated circuit (IC). It is noted that the method of FIG. 1 does not produce completed semiconductor devices 200, 300. Completed semiconductor devices 200, 300 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 6B are simplified for a better understanding of the concepts of the present disclosure. For example, although the figures illustrate the semiconductor devices 200, 300, it is understood the IC may comprise a number of other devices comprising resistors, capacitors, inductors, fuses, etc.

Figure 2:
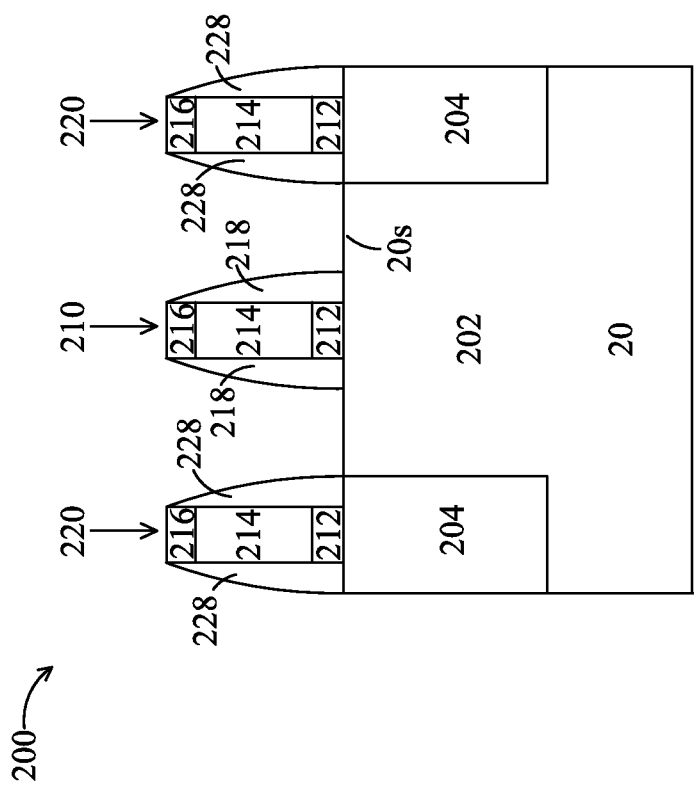

Referring to FIG. 2, a substrate 20 comprising a major surface 20s is provided. In one embodiment, the substrate 20 comprises a crystalline silicon substrate (e.g., wafer). The substrate 20 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

The substrate 20 may alternatively be made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 20 may include an epitaxial layer (epi-layer), may be strained for performance enhancement, and/or may include a silicon-on-insulator (SOI) structure.

In the depicted embodiment, the substrate 20 further comprises a fin structure 202. The fin structure 202, formed on the substrate 20, comprises one or more fins. In the present embodiment, for simplicity, the fin structure 202 comprises a single fin. The fin comprises any suitable material, for example, the fin may comprise silicon, germanium or compound semiconductor. The fin structure 202 may further comprise a capping layer disposed on the fin, which may be a silicon-capping layer.

The fin structure 202 is formed using any suitable process comprising various deposition, photolithography, and/or etching processes. An exemplary photolithography process may include forming a photoresist layer (resist) overlying the substrate 20 (e.g., on a silicon layer), exposing the resist to a pattern, performing a post-exposure bake process, and developing the resist to form a masking element including the resist. The silicon layer may then be etched using reactive ion etching (RIE) processes and/or other suitable processes. In an example, silicon fins of the fin structure 202 may be formed using patterning and etching a portion of the silicon substrate 20. In another example, silicon fins of the fin structure 202 may be formed using patterning and etching a silicon layer deposited overlying an insulator layer (for example, an upper silicon layer of a silicon-insulator-silicon stack of an SOI substrate).

In the depicted embodiment, isolation regions are formed within the substrate 20 to define and electrically isolate the various fins of the fin structure 202. In one example, the isolation regions include shallow trench isolation (STI) regions 204. The isolation regions may comprise silicon oxide, silicon nitride, silicon oxynitride, fluoride-doped silicate glass (FSG), a low-K dielectric material, and/or combinations thereof. The isolation regions, and in the present embodiment, the STI 204, may be formed by any suitable process. As one example, the formation of the STI 204 may include filling trenches between the fins (for example, using a chemical vapor deposition process) with a dielectric material. In some embodiments, the filled trench may have a multi-layer structure such as a thermal oxide liner layer filled with silicon nitride or silicon oxide.

Still referring to FIG. 2, a gate stack 210 is formed on the major surface 20s of the substrate 20 (i.e., a top surface of the fin structure 202), wherein the STI 204 is disposed on one side of the gate stack 210. Further, a dummy gate stack 220 may be optionally formed over the STI 204. In the depicted embodiment, the gate stack 210 and the dummy gate stack 220 comprise a gate dielectric layer 212 and a gate electrode layer 214. The gate stack 210 and the dummy gate stack 220 may be formed using any suitable process, including the processes described herein.

In one example, the gate dielectric layer 212 and gate electrode layer 214 are sequentially deposited on the substrate 20. In some embodiments, the gate dielectric layer 212 may include silicon oxide, silicon nitride, silicon oxynitride, or high-k dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 212 is a high-k dielectric layer with a thickness in the range of about 10 to 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the fin structure 202. The interfacial layer may comprise silicon oxide.

In some embodiments, the gate electrode layer 214 may comprise a single layer or multilayer structure. In the present embodiment, the gate electrode layer 214 may comprise poly-silicon. Further, the gate electrode layer 214 may be doped poly-silicon with the uniform or non-uniform doping. Alternatively, the gate electrode layer 214 may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 214 comprises a thickness in the range of about 30 nm to about 60 nm. The gate electrode layer 214 may be formed using a suitable process such as ALD, CVD, PVD, plating, or combinations thereof.

Then, a layer of photoresist is formed over the gate electrode layer 214 by a suitable process, such as spin-on coating, and patterned to form a patterned photoresist feature by a proper lithography patterning method. In one embodiment, a width of the patterned photoresist feature is in the range of about 15 to 45 nm. The patterned photoresist feature can then be transferred using a dry etching process to the underlying layers (i.e., the gate electrode layer 214 and the gate dielectric layer 212) to form the gate stack 210 and the dummy gate stack 220. The photoresist layer may be stripped thereafter.

In another example, a hard mask layer 216 is formed over the gate electrode layer 214; a patterned photoresist layer is formed on the hard mask layer 216; the pattern of the photoresist layer is transferred to the hard mask layer 216 and then transferred to the gate electrode layer 214 and the gate dielectric layer 212 to form the gate stack 210 and the dummy gate stack 220. The hard mask layer 216 comprises silicon oxide. Alternatively, the hard mask layer 216 may optionally comprise silicon nitride, silicon oxynitride, and/or other suitable dielectric materials, and may be formed using a method such as CVD or PVD. The hard mask layer 216 comprises a thickness in the range from about 100 to 800 angstroms.

Still referring to FIG. 2, the semiconductor device 200 further comprises a dielectric layer formed over the gate stack 210 and the dummy gate stack 220. The dielectric layer may include silicon oxide, silicon nitride, silicon oxynitride, or other suitable material. The dielectric layer may comprise a single layer or multilayer structure. The dielectric layer may be formed by CVD, PVD, ALD, or other suitable technique. The dielectric layer comprises a thickness ranging from about 5 to 15 nm. Then, an anisotropic etching is performed on the dielectric layer to form a pair of sidewall spacers 218 on two sides of the gate stack 210 and a pair of sidewall spacers 228 on two sides of the dummy gate stack 220.

Referring to FIG. 3A, portions of the fin structure 202 (other than where the gate stack 210 and spacers 218 are formed thereover) are recessed to form source and drain (S/D) cavities 222 below the major surface 20s of the substrate 20. In the depicted embodiment, each cavity 222 is distributed between the gate stack 210 and the STI 204, wherein the cavity 222 comprises one sidewall 222c formed by the STI 204, one sidewall 222a formed by the substrate 20, and a bottom surface 222b formed by the substrate 20.

In the depicted embodiment, using the pair of spacers 218 as hard masks, a biased etching process is performed to recess the major surface 20s of the substrate 20 that are unprotected or exposed to form the S/D cavities 222. In one embodiment, the etching process may be performed under a pressure of about 1 mTorr to 1000 mTorr, at a power of about 50 W to 1000 W, with a bias voltage of about 20 V to 500 V, at a temperature of about 40° C. to 60° C., using a HBr and/or $Cl_2$ as etch gases. Also, in the embodiments provided, the bias voltage used in the etching process may be tuned to allow better control of an etching direction to achieve desired profiles for the S/D cavities 222.

In an exemplary embodiment, height H of the S/D cavities 222 may be between about 20 nm and about 70 nm, while width W of the S/D cavities 222 may be between about 50 nm and about 100 nm. In the depicted embodiment, the aspect ratio (H/W) of the S/D cavities 222 is thus between about 0.2 and about 1.4. One skilled in the art will realize, however, that the dimensions and values recited throughout the descriptions are merely examples, and may be changed to suit different scales of ICs.

The process steps up to this point have provided the cavities 222 distributed between the gate stack 210 and the STI 204. Using a low-pressure chemical vapor deposition (LPCVD) process, a strained material such as a silicon germanium (SiGe) layer is selectively grown in the cavities 222 along the sidewall 222a of the substrate 20 and the bottom surface 222b of the substrate 20, but not along the sidewall 222c of the STI 204. This creates a non-uniform distribution of strained materials in the cavities 222. Since the lattice constant of the strained material is different from the substrate 20, the channel region of a semiconductor device is strained or stressed to enhance carrier mobility of the device. However, the non-uniform distribution of strained materials in the cavities 222 causes non-uniformity of strains applied to the channel region of the semiconductor device. Thus, the strained material may not deliver a given amount of strain into channel region of the semiconductor device if one sidewall of the strained material is formed on the STI with an amorphous material such as silicon oxide, resulting in an insufficient on-current of the semiconductor device.

Accordingly, the processing discussed below with reference to FIGS. 4A-6A and 3B-6B may form a cavity filled with a strained structure comprising a SiGe layer and a strained film on the sidewall of the STI. The strained structure may decrease non-uniform distribution of strained material such as the SiGe layer, thereby delivering a given amount of strain into channel region of the semiconductor device. Problems associated with insufficient on-current of a semiconductor device may be avoided, thereby enhancing the device performance.

For fabricating one embodiment of a strained structure 230 (shown in FIG. 6A) of the semiconductor device 200, the structures in FIG. 4A is produced by epi-growing a strained film 206 in the cavities 222 distributed between the gate stack 210 and the STI 204. The strained film 206 thus adjoins the sidewall 222c of the STI 204, the sidewall 222a of the substrate 20, and the bottom surface 222b of the substrate 20.

In the present embodiments, the strained film 206 may comprise II-VI semiconductor material or III-V semiconductor material. In some embodiments, the II-VI semiconductor material comprises a material selected from the group consisting of ZnSe, ZnO, CdTe, and ZnS. In some embodiments, the III-V semiconductor material comprises a material selected from the group consisting of GaAs, InAs, InGaAs, AlAs, AlGaAs, InP, AlInP, InGaP, GaN, AlGaN, InN, InGaN, InSb, InGaAsSb, InGaAsN, and InGaAsP. In the depicted embodiment, the strained film 206 such as gallium arsenic (GaAs) is epi-grown by a metal-organic chemical vapor deposition (MOCVD) process. The MOCVD process is performed at a temperature of about 400° to 500° C., using trimethylgallium (TMGa) and monogerman ($GeH_4$) as reaction gases.

Referring to FIG. 5A, subsequent to the formation of the strained film 206 in the cavities 222, an opening 224 is formed by removing a first portion of the strained film 206 until exposing the bottom surface 222b of the substrate 20, wherein a second portion 206a of the strained film 206 adjoins the sidewall 222c of the STI 204 and a third portion 206b of the strained film 206 adjoins the sidewall 222a of the substrate 20 (i.e., not fully remove the strained film 206 on the sidewall 222a of the substrate 20). The remaining second portion 206a of the strained layer 206 may serve as a strain-keeping layer to help a SiGe layer to strain or stress the channel region of the semiconductor device 200.

In the depicted embodiment, the opening 224 may be formed by an etching process using a reactive ion etch (RIE) and/or other suitable process. In one example, a hydrofluoric acid (HF) or buffered HF may be used to etch the strained film 206 to expose bottom surface 222b of the substrate 20. In one example, a dry etching process used to etch the strained film 206 includes a chemistry including fluorine-containing gas. In furtherance of the example, the chemistry of the dry etch includes $CF_4$, $SF_6$, or $NF_3$.

Referring to FIG. 6A, after the opening 224 is formed by removing a first portion of the strained film 206 until exposing the bottom surface 222b of the substrate 20, a SiGe layer 208 is epi-grown in the opening 224. The SiGe layer 208 thus adjoins the bottom surface 222b of the substrate 20, the second portion 206a of the strained film 206 adjoining the sidewall 222c of the STI 204, and the third portion 206b of the strained film 206 adjoining the sidewall 222a of the substrate 20. The SiGe layer 208 may serve as a strained layer to strain or stress the channel region of the semiconductor device 200.

In some embodiments, a width $W_1$ of the second portion 206a of the strained film 206 is less than a width $W_2$ of the SiGe layer 208. A ratio of the width $W_2$ of the SiGe layer 208 to the width $W_1$ of the second portion 206a of the strained film 206 is from 5 to 100. In one embodiment, a thickness $t_1$ of the second portion 206a of the strained film 206 is greater than a thickness $t_2$ of the SiGe layer 208 (not shown). In another embodiment, a thickness $t_1$ of the second portion 206a of the strained film 206 is less than a thickness $t_2$ of the SiGe layer 208. A ratio of the thickness $t_1$ of the second portion 206a of the strained film 206 to the thickness $t_2$ of the SiGe layer 208 is from 0.8 to 1.2.

In the present embodiment, the SiGe layer 208 and the second portion 206a of the strained film 206 are combined and referred as a strained structure 230. The strained structure 230 may further comprise the third portion 206b of the strained film 206 adjoining the sidewall 222a of the substrate 20. In some embodiments, a width $W_3$ of the third portion 206b of the strained film 206 is substantially equal to the width $W_1$ of the second portion 206a of the strained film 206. The strained structure 230 may decrease non-uniform distribution of the SiGe layer 208, thereby delivering a given amount of strain into channel region of the semiconductor device 200, thereby enhancing the device performance.

Alternatively, for fabricating another embodiment of a strained structure 330 (shown in FIG. 6B) of the semiconductor device 300, the structure in FIG. 3B shows the substrate 20 of FIG. 3A after forming a recess 322 in the STI 204 below the sidewall spacer 228 of the dummy gate stack 220. The sidewall 222c of the STI 204 is thus replaced by a sidewall 322c of the STI 204. In the depicted embodiment, a top portion of the STI 204 adjacent to the sidewall spacer 228 of the dummy gate stack 220 may be removed using a wet etching process, for example, by dipping the substrate 20 in a solution comprising HF. Because the wet etching process has higher etch selectivity for oxide than to silicon and silicon nitride, the etch process removes the STI oxide faster than the silicon substrate 20 and the silicon nitride sidewall spacer 228. Then, a strained film 306 (shown in FIG. 4B) is epi-grown in the recess 322 and the cavity 222. The strained film 306 thus adjoins the sidewall 322c of the STI 204, the sidewall 222a of the substrate 20, and the bottom surface 222b of the substrate 20.

In the present embodiments, the strained film 306 may comprise II-VI semiconductor material or III-V semiconductor material. In some embodiments, the II-VI semiconductor material comprises a material selected from the group consisting of ZnSe, ZnO, CdTe, and ZnS. In some embodiments, the III-V semiconductor material comprises a material selected from the group consisting of GaAs, InAs, InGaAs, AlAs, AlGaAs, InP, AlInP, InGaP, GaN, AlGaN, InN, InGaN, InSb, InGaAsSb, InGaAsN, and InGaAsP. In the depicted embodiment, the strained film 306 such as gallium arsenic (GaAs) is epi-grown by a metal-organic chemical vapor deposition (MOCVD) process. The MOCVD process is performed at a temperature of about 400° to 500° C., using trimethylgallium (TMGa) and monogerman (GeH$_4$) as reaction gases.

Referring to FIG. 5B, subsequent to the formation of the strained film 306 in the recess 322 and cavity 222, an opening 324 is formed by removing a first portion of the strained film 306 until exposing the bottom surface 222b of the substrate 20 and the sidewall 222a of the substrate 20 (i.e., simultaneously removes the strained film 306 on the sidewall 222a of the substrate 20), wherein a second portion 306a of the strained film 306 adjoins the sidewall 322c of the STI 204. In other words, at least a portion of the second portion 306a of the strained film 306 is below the sidewall spacer 228 of the dummy gate stack 220 over the STI 204. The remaining second portion 306a of the strained layer 306 may serve as a strain-keeping layer to help a SiGe layer to strain or stress the channel region of the semiconductor device 300.

In the depicted embodiment, the opening 324 may be formed by an etching process using a reactive ion etch (RIE) and/or other suitable process. In one example, a hydrofluoric acid (HF) or buffered HF may be used to etch the strained film 306 to expose bottom surface 222b of the substrate 20 and the sidewall 222a of the substrate 20. In one example, a dry etching process used to etch the strained film 306 includes a chemistry including fluorine-containing gas. In furtherance of the example, the chemistry of the dry etch includes CF$_4$, SF$_6$, or NF$_3$.

Referring to FIG. 6B, after the opening 324 is formed by removing a first portion of the strained film 306 until exposing the bottom surface 222b of the substrate 20 and the sidewall 222a of the substrate 20, a SiGe layer 308 is epi-grown in the opening 324. The SiGe layer 308 thus adjoins the bottom surface 222b of the substrate 20, the sidewall 222a of the substrate 20, and the second portion 306a of the strained film 306 adjoining the sidewall 322c of the STI 204. The SiGe layer 308 may serve as a strained layer to strain or stress the channel region of the semiconductor device 300.

In the present embodiment, the SiGe layer 308 and the second portion 306a of the strained film 306 are combined and referred as a strained structure 330. The strained structure 330 may further comprise the third portion (not shown) of the strained film 306 adjoining the sidewall 222a of the substrate 20. In some embodiments, a width of the third portion of the strained film 306 is less than a width of the second portion 306a of the strained film 306. The strained structure 330 may decrease non-uniform distribution of the SiGe layer 308, thereby delivering a given amount of strain into channel region of the semiconductor device 300, thereby enhancing the device performance.

After the steps shown in FIGS. 1-6B have been performed, subsequent processes, comprising silicidation and interconnect processing, are typically performed to complete the semiconductor device 200, 300 fabrication.

In accordance with embodiments, a semiconductor device comprises a substrate comprising a major surface; a gate stack on the major surface of the substrate; a shallow trench isolation (STI) disposed on one side of the gate stack, wherein the STI is within the substrate; and a cavity filled with a strained structure distributed between the gate stack and the STI, wherein the cavity comprises one sidewall formed by the STI, one sidewall formed by the substrate, and a bottom surface formed by the substrate, wherein the strained structure comprises a SiGe layer and a first strained film adjoining the sidewall of the STI.

In accordance with other embodiments, a method of fabricating a semiconductor device comprises providing a substrate comprising a major surface; forming a shallow trench isolation (STI) within the substrate; forming a gate stack on the major surface of the substrate, wherein the STI is disposed on one side of the gate stack; forming a cavity distributed between the gate stack and the STI, wherein the cavity comprises one sidewall formed by the STI, one sidewall formed by the substrate, and a bottom surface formed by the substrate; epi-growing a strained film in the cavity; forming an opening by removing a first portion of the strained film until exposing the bottom surface of the substrate, wherein a second portion of the strained film adjoins the STI sidewall; and epi-growing a SiGe layer in the opening.

While the disclosure has been described by way of example and in terms of the preferred embodiments, it is to be understood that the disclosure is not limited to the described embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed:

1. A method of fabricating a semiconductor device, comprising:
   providing a substrate comprising a major surface;
   forming a shallow trench isolation (STI) within the substrate;
   forming a first gate stack on the major surface of the substrate and a second gate stack over the STI, wherein the STI is disposed on one side of the first gate stack, and wherein a sidewall spacer abuts the second gate stack;
   forming a cavity distributed between the first and second gate stacks, wherein the cavity comprises one sidewall defined by the STI, one sidewall defined by the substrate, and a bottom surface defined by the substrate;
   epitaxially growing a strained film in the cavity;
   forming an opening by removing a first portion of the strained film until exposing the bottom surface of the substrate, wherein a second portion of the strained film adjoins the STI sidewall and directly underlies the sidewall spacer of the second gate stack; and
   epitaxially growing a SiGe layer in the opening.

2. The method of claim 1, wherein the step of forming the cavity forms a recess in the STI by a wet etching process.

3. The method of claim 2, wherein the wet etching process is performed in a solution comprising HF.

4. The method of claim 1, wherein the step of forming the opening removes the strained film on the sidewall of the substrate.

5. The method of claim 1, wherein the step of forming the opening does not fully remove the strained film on the sidewall of the substrate.

6. The method of claim 1, wherein the forming the cavity distributed between the first and second gate stacks includes aligning the sidewall formed by the STI with the sidewall spacer abutting the second gate stack.

7. The method of claim 1, wherein the providing the major surface provides a top surface of a fin structure of the substrate.

8. The method of claim 1, wherein the forming the STI defines a fin structure on the substrate; and
   wherein the forming the first gate stack provides forming the first gate stack on at least at least on surface of the fin structure.

9. The method of claim 8, wherein the forming the cavity includes forming the cavity in the fin structure.

10. The method of claim 1, wherein the forming the cavity includes etching the substrate and etching the STI.

11. The method of claim 1, wherein the forming the cavity includes using spacers abutting the first gate stack as a hard mask during the forming the cavity.

12. The method of claim 1, wherein the epitaxially growing the strained film in the cavity includes epitaxially growing at least one of a II-VI semiconductor material and a III-V semiconductor material.

13. The method of claim 1, wherein the epitaxially growing the strained material includes growing at least one of ZnSe, ZnO, CdTe, ZnS, GaAs, InAs, InGaAs, AlAs, AlGaAs, InP, AlInP, InGaP, GaN, AlGaN, InN, InGaN, InSb, InGaAsSb, InGaAsN, and InGaAsP.

14. The method of claim 1, wherein the epitaxially growing the strained material includes growing at least one of ZnSe, ZnO, CdTe, and ZnS.

15. A method of fabricating a semiconductor device, comprising:
   forming a shallow trench isolation (STI) within a semiconductor substrate;
   forming a gate stack over the semiconductor substrate;
   forming a cavity in the semiconductor substrate between the gate stack and the STI, wherein the forming the cavity includes removing a portion of the STI to form a recessed sidewall of the STI;
   growing an epitaxial film such that the epitaxial film is disposed on a sidewall of the cavity adjacent the STI;
   etching the epitaxial film to expose a bottom surface of the cavity defined by the semiconductor substrate, wherein after the etching the epitaxial film abuts the recessed sidewall of the STI and wherein the etching the epitaxial film includes removing the epitaxial film from a sidewall of the cavity adjacent the gate stack; and
   epitaxially growing a semiconductor layer in the opening from the bottom surface of the cavity.

16. The method of claim 15, wherein the forming the cavity is performed by a wet etching process.

17. The method of claim 15, wherein the growing the epitaxial film includes growing at least one of a II-VI semiconductor material and a III-V semiconductor material.

18. The method of claim 17, wherein the growing the epitaxial film is performed by a metal-organic chemical vapor deposition (MOCVD) process.

19. The method of claim 15, wherein the etching the epitaxial film is performed by a reactive ion etch (RIE).

* * * * *